US012665165B2

(12) United States Patent
Lechner

(10) Patent No.: US 12,665,165 B2
(45) Date of Patent: Jun. 23, 2026

(54) METHOD FOR PREPARING A MICROSCOPIC SAMPLE FOR FIB/SEM TOMOGRAPHY

(71) Applicant: Carl Zeiss Microscopy GmbH, Jena (DE)

(72) Inventor: Lorenz Lechner, Arlington, VA (US)

(73) Assignee: Carl Zeiss Microscopy GmbH, Jena (DE)

( * ) Notice: Subject to any disclaimer, the term of this patent is extended or adjusted under 35 U.S.C. 154(b) by 352 days.

(21) Appl. No.: 18/480,012

(22) Filed: Oct. 3, 2023

(65) Prior Publication Data

US 2024/0120175 A1 Apr. 11, 2024

Related U.S. Application Data

(60) Provisional application No. 63/413,816, filed on Oct. 6, 2022.

(51) Int. Cl.
*H01J 37/305* (2006.01)

(52) U.S. Cl.
CPC ..... *H01J 37/3056* (2013.01); *H01J 2237/221* (2013.01); *H01J 2237/31745* (2013.01); *H01J 2237/31749* (2013.01)

(58) Field of Classification Search
CPC ............. H01J 37/3056; H01J 2237/221; H01J 2237/31745; H01J 2237/31749; G01N 2001/2873; G01N 2001/2886; G01N 1/286; G01N 23/2251; G01N 23/2202; B23K 26/364
See application file for complete search history.

(56) References Cited

U.S. PATENT DOCUMENTS

| | | | | |
|---|---|---|---|---|
| 5,907,157 A | * | 5/1999 | Yoshioka | ............ H01J 37/3056 250/492.2 |
| 6,855,938 B2 | * | 2/2005 | Preikszas | .............. H01J 37/145 250/311 |
| 7,750,293 B2 | | 7/2010 | Principe | |
| 8,455,824 B2 | | 6/2013 | Muto et al. | |
| 9,103,753 B2 | | 8/2015 | Lechner et al. | |
| 9,947,507 B2 | * | 4/2018 | Lechner | .................. G01N 1/32 |

(Continued)

FOREIGN PATENT DOCUMENTS

| DE | 10 2010 032 894 A1 | 2/2012 | |
|---|---|---|---|
| DE | 102015219298 A1 * | 4/2017 | ........... B23K 26/352 |

(Continued)

OTHER PUBLICATIONS

GPTO Office Action, with translation thereof, for corresponding DE Appl No. 10 2022 127 254.0, dated Jun. 27, 2023.

(Continued)

*Primary Examiner* — Wyatt A Stoffa
*Assistant Examiner* — Christopher J Gassen
(74) *Attorney, Agent, or Firm* — Fish & Richardson P.C.

(57) ABSTRACT

A method for preparing a volume of interest from a bulk sample uses a particle beam system configured to accommodate and to image the bulk sample and configured to provide a particle beam for the removal of material from the bulk sample. Moreover, the particle beam system is configured to define trimming regions. A trimming region determines location and size of a volume to be removed from the bulk sample.

15 Claims, 10 Drawing Sheets

(56) References Cited

U.S. PATENT DOCUMENTS

| | | | | |
|---|---|---|---|---|
| 2002/0079463 A1* | 6/2002 | Shichi | .................... | G01N 23/20 |
| | | | | 850/52 |
| 2004/0129897 A1* | 7/2004 | Adachi | ................. | G01N 1/286 |
| | | | | 250/311 |
| 2005/0118065 A1* | 6/2005 | Hasegawa | ............. | H01J 37/305 |
| | | | | 422/502 |
| 2005/0211922 A1* | 9/2005 | Munekane | .............. | H01J 37/31 |
| | | | | 250/492.21 |
| 2008/0073586 A1* | 3/2008 | Iwasaki | .............. | G01N 23/2251 |
| | | | | 250/492.21 |
| 2010/0176296 A1* | 7/2010 | Kaito | .................. | H01J 37/3056 |
| | | | | 250/307 |
| 2010/0215868 A1* | 8/2010 | Iwasaki | .................... | G21K 5/04 |
| | | | | 250/307 |
| 2012/0189813 A1* | 7/2012 | Lechner | .................. | G01N 1/32 |
| | | | | 428/156 |
| 2013/0213945 A1* | 8/2013 | Stegmann | .............. | G01N 23/04 |
| | | | | 219/121.83 |
| 2013/0319849 A1* | 12/2013 | Fuller | ................. | H01J 37/3026 |
| | | | | 204/298.36 |
| 2015/0001176 A1* | 1/2015 | Young | ................. | H01J 37/3178 |
| | | | | 216/37 |
| 2016/0247662 A1* | 8/2016 | Fujii | ..................... | H01J 37/222 |
| 2018/0218878 A1* | 8/2018 | Xu | ........................... | H01J 37/28 |
| 2020/0264115 A1* | 8/2020 | Phaneuf | ........... | G01N 23/20025 |
| 2021/0018403 A1* | 1/2021 | Thaler | .................... | H01J 37/244 |
| 2022/0157560 A1* | 5/2022 | Willard | .................... | H01J 37/31 |
| 2022/0246388 A1 | 8/2022 | Rauwolf et al. | | |
| 2023/0298855 A1* | 9/2023 | Effting | .................. | G01N 1/286 |
| | | | | 250/307 |

FOREIGN PATENT DOCUMENTS

| | | |
|---|---|---|
| DE | 10 2021 200 799 B3 | 3/2022 |
| DE | 10 2021 201 686 A1 | 5/2022 |
| DE | 10 2021 130 710 A1 | 6/2022 |

OTHER PUBLICATIONS

Holzer, L., & Cantoni, M., Chapter 11: Review of FIB tomography. UTKE: Nanofabrication Using Focused Ion and Electron Beams, I. Utke, S. Moshkalev, & p. E. Russel (Eds.), Nanofabrication using focused ion and electron beams: principles and applications (pp. 410-435). Oxford University Press. 2012.

Gianuzzi L. A. (2006) Introduction to Focused Ion Beams, Springer, chapter 14 + 15.

* cited by examiner

Provide bulk sample with VOI — S1

Arrange bulk sample in 1st orientation — S2

Record 1st image — S3

Define cross-section trimming region — S4

Excavate cross-section — S5

Arrange bulk sample in 2nd orientation — S6

Record 2nd image — S7

Define lateral trimming regions — S8

Remove lateral volumes — S9

Analyse VOI / Process VOI — S10

Provide bulk sample with VOI — S11

Arrange bulk sample in 1st orientation — S12

Record 1st image — S13

Define lateral trimming region — S14

Remove lateral volumes — S15

Arrange bulk sample in 2nd orientation — S16

Record 2nd image — S17

Define cross-section trimming region — S18

Excavate cross-section — S19

Analyse VOI / Process VOI — S20

METHOD FOR PREPARING A MICROSCOPIC SAMPLE FOR FIB/SEM TOMOGRAPHY

CROSS-REFERENCE TO RELATED APPLICATION

This application claims priority under 35 U.S.C. § 119 to U.S. Ser. No. 63/413,816, filed Oct. 6, 2022, and entitled "METHOD FOR PREPARING A MICROSCOPIC SAMPLE FOR FIB/SEM TOMOGRAPHY," the entire contents of which are hereby incorporated by reference.

FIELD

The present disclosure relates to methods for preparing a microscopic sample for FIB/SEM tomography. During the suggested procedure, sample material is removed by milling with the help of a focused ion beam (FIB) or a laser beam.

BACKGROUND

It is often desirable to examine and image three-dimensional structures, which are located in a microscopic sample. To that end, tomographic methods are employed, in which individual planes of a three-dimensional sample are imaged in order to create a series of images, which represent the sample planes. Such imaging procedures are known as "slice & view", "serial sectioning" or "serial section imaging". Using the series of images (the so-called stack of images), it is then possible to create a 3D reconstruction of the three-dimensional sample structure.

The preparation of a sample for FIB/SEM tomography with coarse methods such as cutting with knife, microtome, saw, milling machine, or laser is often not sufficiently precise. In some cases, an additional fine preparation is used. To that end, the sample can subsequently be machined via an ion beam or a laser beam or a combination of ion beam and laser beam. Moreover, during the fine preparation a better target geometry can be maintained.

In general, in tomography methods, very thin layers of a volume of interest (VOI), which is initially located in the interior of a bulk sample, are successively ablated, so that the VOI is stepwise removed. Usually, the sample has for instance a thickness of a few nanometers, micrometers or millimeters. For every exposed slice, an image can be recorded. In order to prepare and to machine the sample in such a way, a FIB/SEM combination device can be deployed for example.

A FIB/SEM combination device should be understood to mean a microscope system, which, in addition to a scanning electron microscope (SEM) also includes an ion beam column for generating a focused ion beam (FIB). By using the ion beam it is possible to ablate material from the sample, while the SEM allows imaging the sample. Moreover, it is also conceivable to deposit material on the sample surface with the help of the ion beam in cooperation with a gas injection system (GIS). Additionally, or alternatively, a laser beam can be used to mill bulk sample material. This can be desirable, for example, when larger volumes are to be removed.

In FIB/SEM tomography, in general, subsequent layers are ablated by milling with a focused ion beam (FIB). These layers are typically less than 10 nm thick. The successively exposed slices of the sample are usually imaged with the aid of the SEM, thus creating a plurality of serial images. The images obtained can then be combined to create a three-dimensional reconstruction of the sample structure.

Although there have been large technological improvements over the past years, FIB/SEM tomography as a high-resolution 3D analytical tool is still not as widely used as it could be, because, for example, it can be a time-consuming application. Particularly, there are two main causes related to the conventional sample geometry that can reduce processing speed: bulk effects and surface topography.

A contribution to excess milling time can be overdosing of the milling volume. If the material removal is not sufficient for one single slice of the stack, all subsequent slices may be rendered useless.

Thus, the slice using the highest milling dose can govern the milling dose for all other slices. Adapting the milling dose on a per-slice-basis is usually complicated. In inhomogeneous samples this can be magnified, when the milling dose is not a priori known for all slices.

Usually, ablating of sample material is managed by milling trenches with the focused ion beam. However, in a bulk sample, the signal generated by the ion beam hitting the bottom of the milling trench (wherein the bottom of the milling trench is more or less perpendicular to the impinging particle beam) generally precludes to measure the milling process in a straight-forward manner.

In addition, the bulk geometry has often other detrimental effects on data acquisition speed.

Firstly, material scattering back from the bottom of the milling trench can be deposited on the cross-section to be prepared. This can effectively reduce milling rate.

Secondly, backscattered material can deposit on the sidewalls of the milling trench, which can progressively block the SEM view of the cross-section. To counteract this effect, a volume much wider than the actual VOI can be removed. Since this "dead width" increases with both depth and length of the VOI, the actual milling time can scale in excess of the volume. This can add significantly to the processing time as this extra material has to be removed.

Furthermore, conventional sample geometry can magnify issues specific to non-conductive samples by allowing the trapping of charging in the bulk material.

Another factor that can affect speed, ease-of-use and result quality of FIB/SEM tomography is surface topography of the sample.

Microscopic surface variations can lead to uneven cross-sections. In some cases, this "curtaining" effect can only be mitigated by depositing thick protective layers and/or reducing FIB milling current. However, both measures can be detrimental to processing speed.

Mesoscopic surface variations or misaligned surface orientations can cause the ion beam to be in focus only on certain portions of the surface. Under-focused or over-focused milling on the rest of the sample can be another source of curtaining artifacts. In some cases, such artifacts can only be avoided by increasing depth of focus by reducing the ion current.

In addition, surface topography can severely impede techniques that use markers attached to the sample surface in order to control milling and data processing.

Nevertheless, conventional FIB/SEM tomography methods provide no mechanism for reducing surface topography in-situ. Instead, surface polishing is performed as an ex-situ process. This can be another time consuming and error prone process.

It is known to produce tomographic images. By way of example, U.S. Pat. No. 7,750,293 B2 discloses a method to generate tomographic images in a scanning electron microscope. To do so, two longitudinal marks are provided on the sample surface.

DE 10 2021 201 686 A1 suggests a method for the preparation of a TEM lamella with the help of two different particle beams, wherein—as an intermediate step—a thick lamella is created that comprises the TEM lamella.

U.S. Pat. No. 9,947,507 B2 describes a method for preparing cross-sections by ion milling. Here, however, the region of interest remains in the bulk sample, so that another procedure for preparing of a tomographic sample follows.

U.S. Pat. No. 8,455,824 B2 discloses a method for producing a thin film sample, wherein at least two cross-sections are created in the sample.

SUMMARY

The disclosure provides a method for preparing an exposed volume of interest from a bulk sample. The exposed VOI can then be submitted to a tomographic analysis in a subsequent procedure. Moreover, the disclosure comprises a related computer program product.

In some embodiments of the disclosure, most of the material surrounding the VOI is relatively quickly removed, so that an exposed VOI is created. Thus, the VOI is easily accessible from at least three sides, to the best advantage from five sides.

In some embodiments of the disclosure, in order to prepare the tomographic sample (i. e. the exposed VOI), bulk material surrounding the VOI is being removed by trimming with a particle beam in a special manner. For example, the particle beam can be a charged particle beam or a laser beam. The charged particle beam can be a focused ion beam (FIB) or a focused electron beam. It is also conceivable that two or more of the particle beam types are provided in the used particle beam device, so that milling can be carried out with the help of different particle beam types.

The method can be performed with the help of a particle beam system, for example with a FIB system, a FIB-SEM system, a SEM-laser system or a FIB-SEM-laser system. The particle beam system is configured to generate at least one particle beam, which is directed towards the sample and propagates along an optical axis.

An aim of the disclosure is to expose a VOI that originally has been located in the interior of a bulk sample. A bulk sample should be understood as a block-like substrate, for example a semiconductor device.

In general, the localization of the VOI in the bulk sample can be analysed with non-destructive methods such as ultrasonic microscopy, X-ray microscopy, light microscopy, or lock-in thermography. It is also conceivable that the location can be determined from the knowledge of the structure, for example derived from production data. Additionally, certain alignment marks (sample structures or artificially generated marks) can support the localization of the sample, especially if different particle beam systems are used.

According to the disclosure, that the bulk sample can be relocated during the procedure. To do so, the bulk sample can be arranged at least in a first orientation and in a second orientation relative to the optical axis of the particle beam system. To expose the VOI, three cuts can be performed for removal of bulk material: A cross-section near the VOI or adjacent to the VOI and two essentially parallel cuts, that are aligned more or less perpendicular to the cross section.

Each cut can be performed by removing a series of adjacent and/or overlapping volumes. Here, it turned out to be advantageous, when these volumes are milled subsequently proceeding inwards from the sample surface. The cross-section can be excavated by milling a milling groove in the bulk sample. A milling groove should be understood as a specially oriented milling trench, wherein the longitudinal extent of this kind of trench is more or less parallel to the impinging particle beam due to a grazing incidence of the particle beam.

The cuts can be performed by milling with a particle beam, wherein the impinging beam is oriented essentially parallel or tangential to one side of the VOI.

In order to precisely determine the region, where material is to be removed, at least one trimming region can be defined on the basis of an image of the sample. First and foremost, the trimming region determines the area, i. e. the two-dimensional extent of the processing site. However, the volume to be removed is not only defined by the two-dimensional region but also by the depth, i. e. the sample material located in the projection in the direction of the beam. Therefore, the definition of a trimming region should also comprise adequate information about the extent of the volume. Thus, with the help of a trimming region, location and size (i. e. three-dimensional extent) of a volume to be precisely removed can be determined.

In general, it is conceivable to continue milling until all sample material is removed. This means that all the volume located in the projection in direction of the particle beam is removed. Alternatively, the material removal can be observed under visual control (e. g. by SEM imaging) until the desired level of removal (i. e. the desired depth) is reached. Moreover, it is possible that structure and dimensions of the bulk sample are well-known a priori, so that the milling can be executed until a desired depth is reached.

Generally, at least as much volume is removed as desired to completely expose the VOI that should be analyzed by FIB/SEM tomography in a subsequent procedure. This means that the depth of the volume can be selected in accordance with the extension in depth of the planned tomography.

To perform the cuts, the bulk sample is held in a first orientation while the cross-section is cut, whereas the bulk sample is arranged in a second orientation, when the parallel cuts are performed. However, the disclosure is not restricted to this sequence of cutting. It is also possible to perform the parallel cuts first, followed by trimming the cross-section.

Summarizing, the workpiece is relocated between the trimming procedures, the relocation being performed by rotating the workpiece relative to the impinging particle beam, e.g. relative to the optical axis of the particle beam system.

Depending on the exact location of the VOI within the bulk sample, it is also conceivable to omit one of the three cuts. For example, this can be the case, when the interesting region is coincidentally located at the surface of the bulk sample. Then, it might be possible to omit the cross-section cut.

The proposed method can reduce both preparation time and data acquisition time, thus speeding up the investigation and expanding economic applicability of FIB/SEM tomography.

BRIEF DESCRIPTION OF THE DRAWINGS

FIGS. 1A and 1C are a three-dimensional representation of the bulk sample, whereas FIGS. 1B and 1D show a section view of the same sample.

DETAILED DESCRIPTION

Figure 1B:
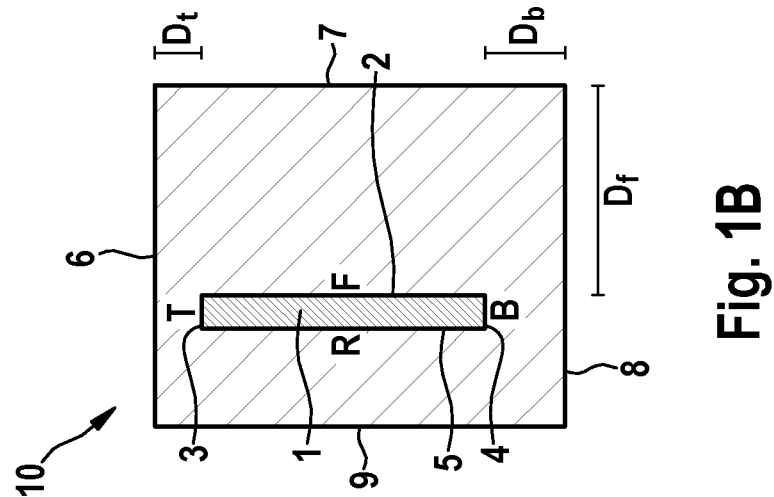
FIGS. 1A-1D show schematically a volume of interest (VOI), which is located within a bulk sample.
Figure 1A:
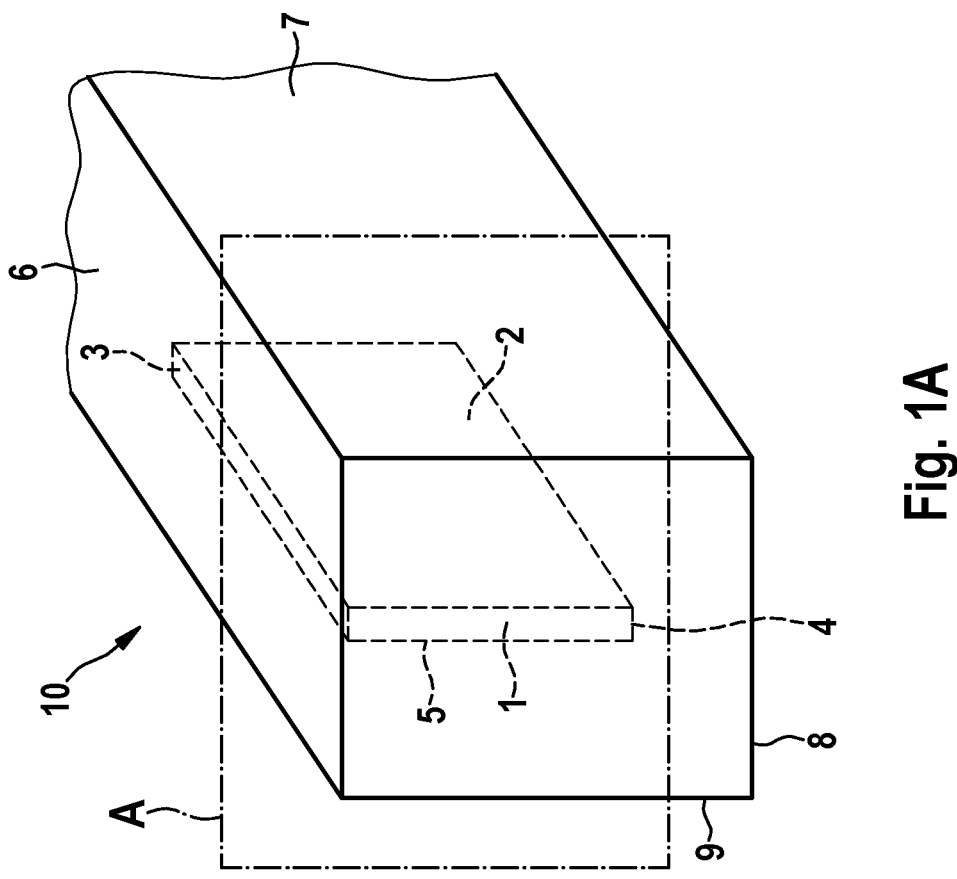

FIGS. 1A-1D depict an exemplary volume of interest (VOI) 1 which should be analyzed with microscopical FIB/SEM tomography methods. FIG. 1A and FIG. 1B show the initial situation, wherein the VOI 1 is located in the interior of a bulk sample 10. In order to prepare the VOI 1 for the tomographic analysis, the internal VOI 1 is excavated from the bulk sample 10.

Figure 1D:
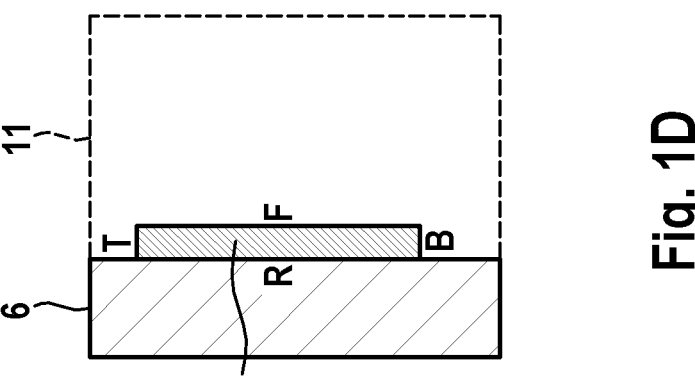
Figure 1C:
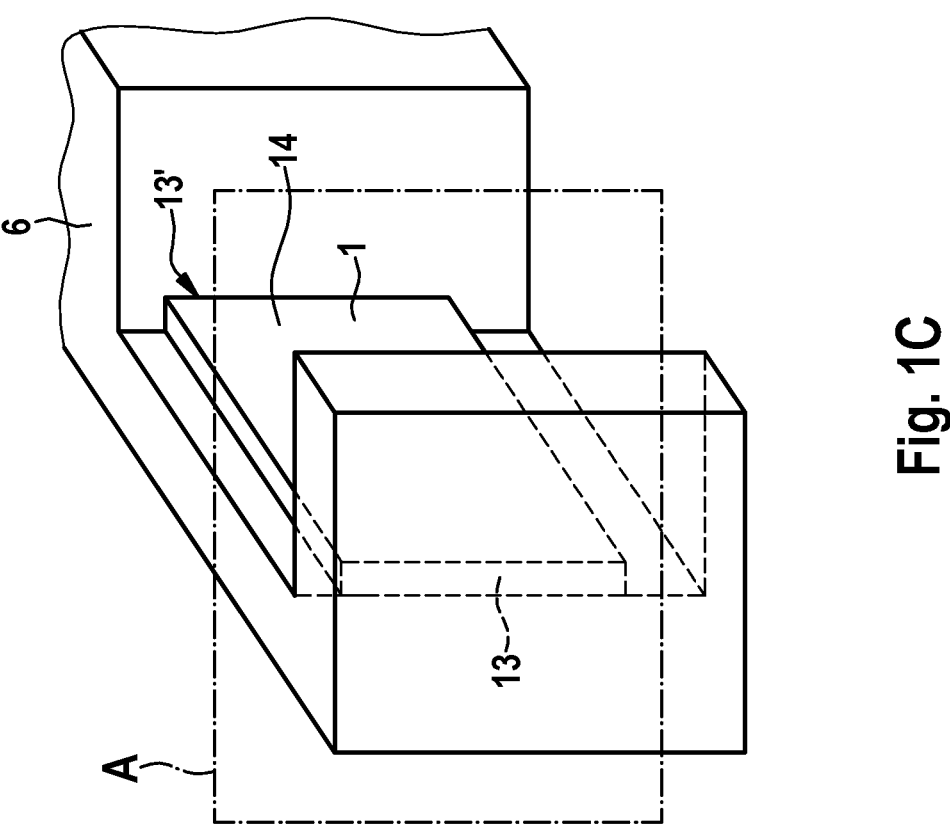

An aim of the preparation method according to the disclosure is to provide the VOI 1 in such a way, that the VOI 1 is exposed in at least three sides, as shown in FIG. 1C (three-dimensional representation) and FIG. 1D (sectional view). In other words, according to the disclosure an exposed VOI can be prepared out of a bulk sample 10.

In the exemplary embodiment of FIGS. 1A-1D, the VOI 1 has a cuboid shape. However, the shape of the bulk sample 10 and the VOI 1 is not restricted to a cuboid. The cuboid VOI 1 shows a first side 2, which is called front side (F), a second side 3, which is called top side (T), a third side 4, which is called bottom side (B) and a fourth side 5, which is called rear side (R).

In accordance with the cuboid shape, front side 2 is arranged substantially perpendicular to top side 3. Top side 3 and bottom side 4 are substantially arranged in a parallel manner, and the fourth side 5 (rear side) of the VOI 1 is substantially parallel to front side 2.

In the example shown in FIGS. 1A-1D, the VOI 1 is completely incorporated in the bulk sample 10 before the method of the disclosure is performed. The bulk sample 10 comprises surfaces, which can be machined or imaged from the outside. These surfaces are called top surface 6, front surface 7, bottom surface 8 and rear surface 9, as they correspond to top side 3, front side 2, bottom side 4 and rear side 5 of the internal VOI 1 respectively.

Front side 2 of the VOI 1 is located at a distance Df from the front surface 7 of the bulk sample 10, as shown in FIG. 1B. Bottom side 4 is located at a distance db from the bottom surface 8 of the bulk sample 10, whereas the distance between second side 3 and top surface 6 of the bulk sample is Dt.

In the exemplary embodiment of FIGS. 1A-1D, distance Dt is smaller than distance Df and distance db. This means that top side 3 is the one side of the VOI 1 that is closest to a surface of the bulk sample 10. This might be a hint that the removal of the volume of material covering top side T can involve less time than removing sample material covering the other sides.

Hence, by appropriately assigning top side T, bottom side B, rear side R and front side F, the duration of the preparation time can be optimized. However, this is not mandatory, because top side T, bottom side B and front side F can be selected freely.

After the preparation according to the present disclosure, the VOI 1 can be excavated as shown in FIG. 1C (three-dimensional representation) and FIG. 1D (side view). Material of the bulk sample has been removed in order to expose the VOI, especially to expose the front side of the VOI For example, this can be done by ablating a milling groove 14 with a grazing particle beam (grazing relative to the front side F of the VOI).

The dotted lines 11 (FIG. 1D, side view) indicate the initial extent of the bulk sample. The bulk sample material incorporated by the dotted lines 11 has been removed during the sample preparation according to the disclosure.

Finally, the VOI 1 is laid bare, which means that the VOI 1 is in contact to the bulk material only at rear side R and two lateral sides, i.e. a first lateral side 13 and a second lateral side 13'. The second lateral side 13' is opposing lateral side 13 and not directly viewable in the representation of FIGS. 1C and 1D.

In the exposed VOI 1, front side F, top side T and bottom side B are exposed, so that these sides F, T and B of the VOI 1 can be imaged and/or machined in a subsequent analysis and or machining procedure. This means that the excavated VOI is directly ready to be analyzed by FIB/SEM tomography.

In an embodiment, the two lateral sides 13 and 13' can also be exposed, so that the VOI 1 is in contact to the bulk sample material only via rear side R. In other words: five of the six sides of the essentially cuboid VOI are exposed, so that the VOI is almost completely laid bare. In particular, this can be helpful for subsequent analysis procedures such as FIB/SEM tomography.

Figure 8A:
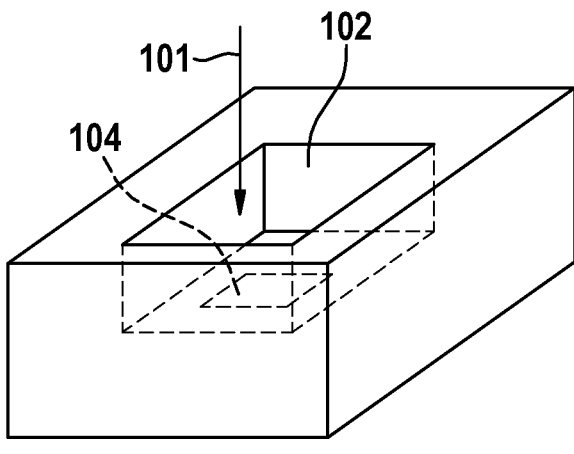
FIGS. 8A-8C shows schematically a milling groove (FIGS. 8B and 8C) in comparison to a conventional milling trench (FIG. 8A).
Figure 8B:
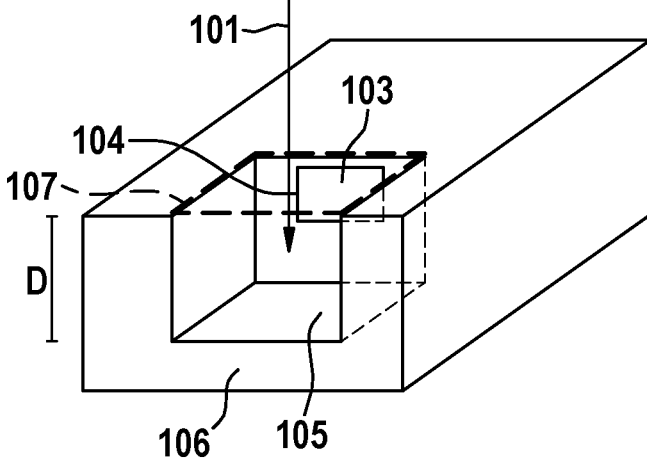
Figure 8C:
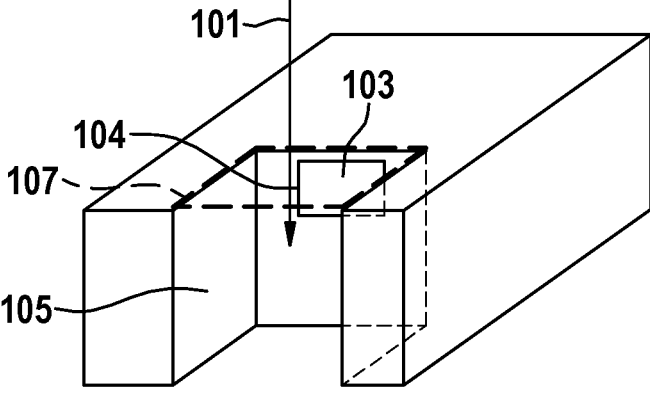

According to the disclosure, the material removal is executed by milling a milling groove. FIGS. 8A-8C illustrate the characteristic features of a milling groove 105 (FIGS. 8B and 8C) according to the present disclosure compared to a conventional milling trench 102 (FIG. 8A).

A milling trench 102 should be understood as an—often oblong—bore hole in the sample material. The particle beam impinges on a surface of the bulk sample thus creating the bore hole. The depth of the milling trench is limited by a bottom side, onto which the particle beam impinges more or less in a perpendicular way.

If regarding the milling trench as a cuboid, the milling trench 102 is limited by the bottom side and four lateral sides. Only one side (of the six sides of the cuboid) is open. The open side is the opening through which the particle beam irradiates. This means that the milling trench 102 is a kind of a blind bore hole. Consequently, in general, the ablated material can only be removed via the bore hole opening, so that redeposition is likely to occur.

Unlike a milling trench, a milling groove 105 is not a blind bore hole. A milling groove is open at least at two sides (FIG. 8B), often it is open at three sides (FIG. 8C). This turned out to be advantageous, because the ablated material can be removed via the open sides so that redeposition is reduced or prevented.

Moreover, the particle beam 101, which impinges into the milling groove 105, is not directed to the VOI Instead, the particle beam 101 is oriented parallel or tangential relative to the VOI 104 due to the fact, that the particle beam 101 is grazing relative to the VOI 104 (more precisely: grazing to the front side 103 of the VOI). Moreover, the particle beam 101 is grazing relative to the longitudinal expansion of the milling groove 105, so that the longitudinal side of the milling groove 105 is oriented parallel to the front side of the VOI 103.

According to the disclosure, the creating of a milling groove can be managed by defining a trimming region with the help of a milling box 107. The milling box 107 can be shown in the user interface of the particle beam system, e. g. by superimposing a currently recorded image of the bulk sample.

The definition of a trimming region comprises information about the location of the sample region that should be machined. The desired location can be determined by positioning a milling box 107 at the desired location in the image of the bulk sample. The milling box 107 defines the sample region to be machined, so that the two-dimensional extent of the sample region is characterized. Moreover, the definition of a trimming region comprises information about the size of the volume (i. e. the extent in the third dimension) that should be removed from the bulk sample.

The material removal can be stopped when the desired depth D of the milling groove 105 is reached, as shown in FIG. 8B. Here, some bulk sample material 106 remains in the projection of the impinging particle beam 101 (i. e. in the projection of the trimming region, shown as milling box 107).

Alternatively, the milling process can be continued until all bulk sample material is removed in the projection of the trimming region, as shown in FIG. 8C. This means that all the volume located in the projection of the direction of the particle beam 101 is removed. This alternative turned out to be advantageous, because unwanted redeposition processes are avoided.

FIGS. 2A-2E show a schematic layout of an embodiment of the disclosure in a two-dimensional representation.

As already mentioned above, the shape of the bulk sample 20 is not restricted to a cuboid. In fact, the bulk sample 20 can have any other shape, for example it can be spherical or exhibit an irregular shape. FIGS. 2A-2E depict in sideview an exemplary bulk sample 20 that has an irregular compact shape. The VOI 21 is located within the bulk sample 20. For a better understanding of the procedure, one can define a front side F and a rear side R of the VOI 21.

Figures 2A, 2B, 2C, 2D, 2E:
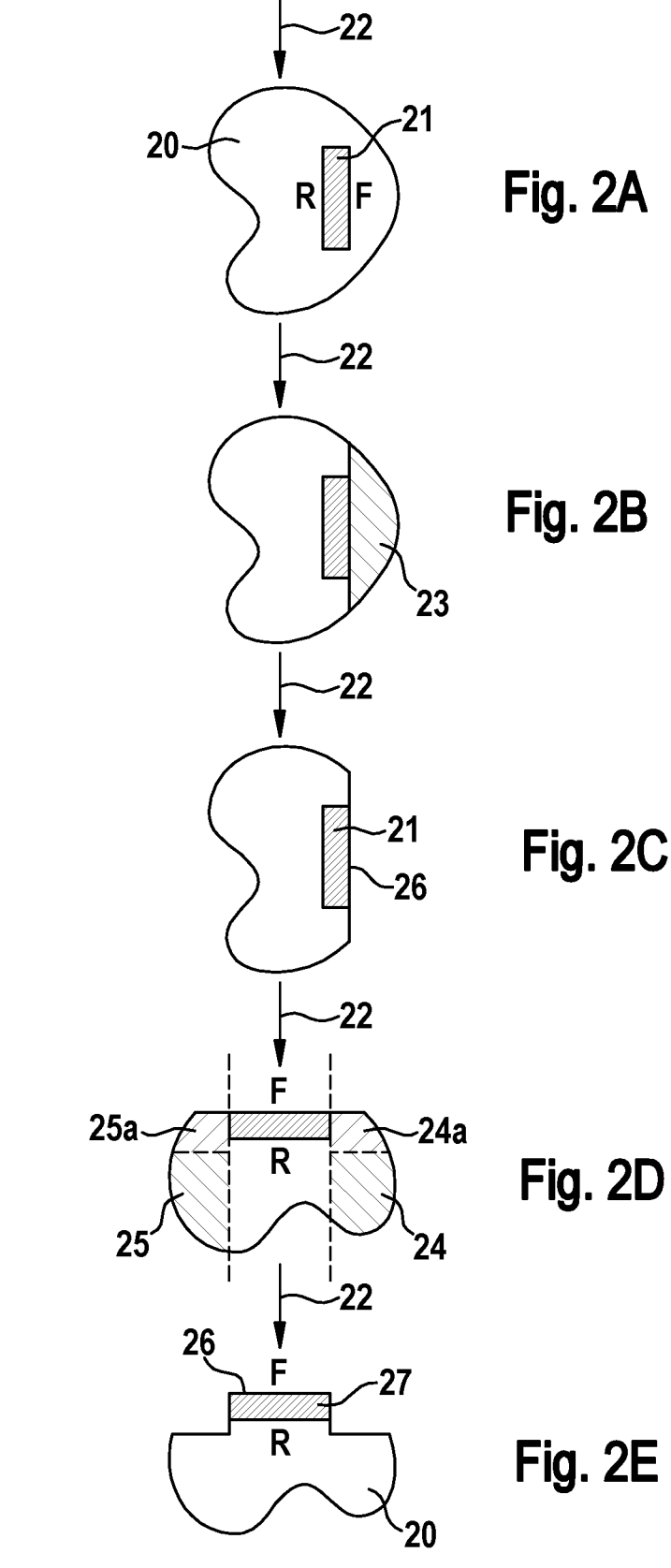
FIGS. 2A-2E show a schematic layout of an embodiment of the disclosure in two-dimensional representation.

During the method of the disclosure, the bulk sample 20 is arranged in a first orientation relative to the impinging beam of particles 22, e. g. a focused ion beam (FIG. 2A). With the help of the particle beam 22, a first trimming volume 23 can be defined and removed (FIG. 2B), so that a cross-section 26 through the bulk sample 20 (optionally in the vicinity of the VOI 21) is excavated (FIG. 2C). It can be advantageous when the cross-section is cut in a way that the front side F of the VOI 21 is laid bare.

Then, the bulk sample 20 is arranged in a second orientation relative to the impinging particle beam 22 as shown in FIG. 2D. This can be done by rotating the bulk sample relative to the particle beam e.g. due to movement of the sample stage or by changing the orientation of the particle beam.

The second orientation is different from the first orientation, for example by rotating the sample by 90° relative to the optical axis of the particle beam system, so that the formerly machined surface is now facing the particle beam 22.

A second trimming volume 24 and a third trimming volume 25 are defined and removed (FIG. 2D) in order to create the exposed VOI 27 (FIG. 2E). The exposed VOI 27 is in contact to the bulk sample 20 via rear side R and both lateral sides of the VOI 21, while the other sides of the VOI 21 have been exposed. It is also possible to expose the first lateral side and the second lateral side, so that the VOI is attached to the bulk sample only via rear side R.

It turned out that it can be beneficial if one of the lateral volumes (for example volume 24a) is removed under visual control with the help of SEM imaging. When doing so, it is advantageous to keep the milling parameters as a blueprint for milling the opposite lateral volume (in the example: volume 25a), in case the milling procedure of the opposite lateral volume might not be visible via SEM imaging due to shadowing effects.

Alternatively, it is also conceivable to image the milling process with the help of the focused ion beam (FIB). Another possibility is to temporarily change the orientation of the bulk sample to allow imaging and visual control of the milling process.

Here, volumes 24 and 25 can be removed completely (shown as hatched regions 24, 24a and 25, 25a). However, this may involve some time and may remove a volume that is greater than might be desired. Thus, it may be advantageous to remove only subsections 24a, 25a, which are directly adjacent to the VOI. The adjacent parts 24a and 25a should be understood as the regions (i.e., volumes) of volume 24 and volume 25, respectively, facing the impinging particle beam and being adjacent to the VOI 21. The adjacent parts 24a, 25a are located at opposite sides of the VOI.

After having removed volumes 24a and 25a, an exposed VOI 27 has been created, showing a cross-section 26. In the current orientation of the VOI 27 the cross-section 26 is facing the impinging particle beam 22, so that the cross-section can be imaged or machined in a procedure without rearranging the VOI.

However, it is also possible to rotate the VOI by rotating the bulk sample by −90°, so that the cross-section 26 is aligned more or less parallel to the impinging particle beam. Of course, the VOI can be rotated by any other angle, depending on the desired properties of the following procedure.

Figure 3A:
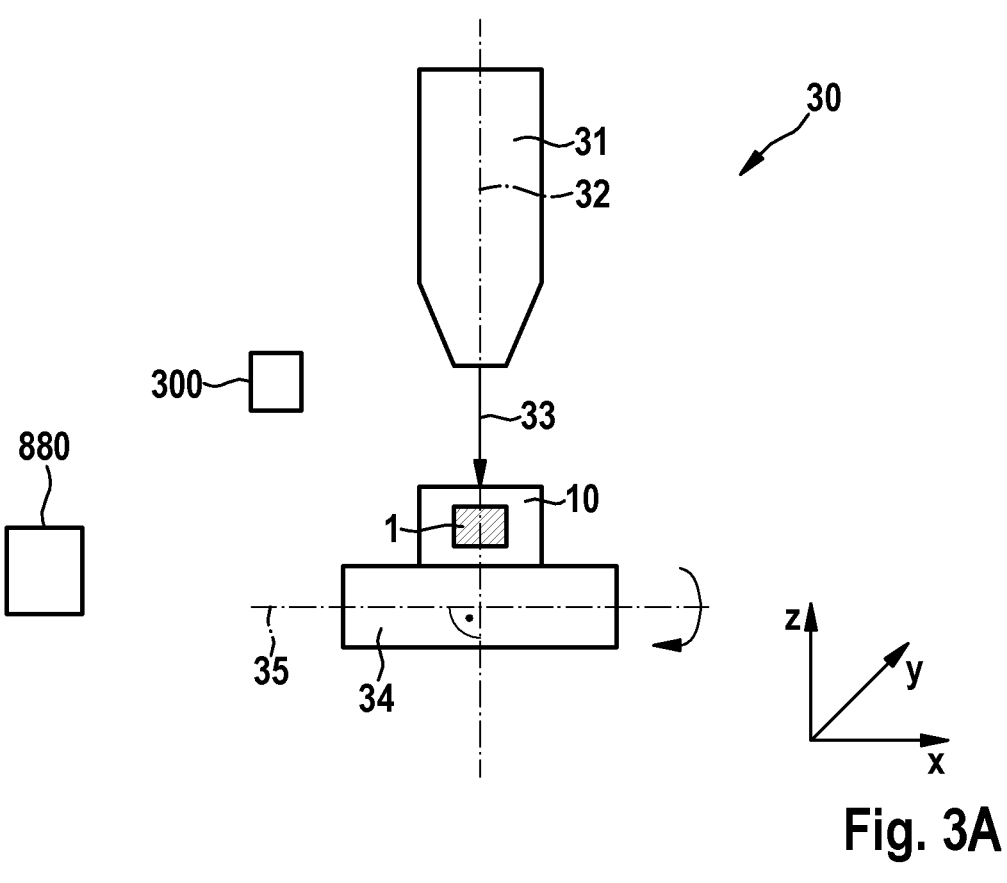
FIGS. 3A-3B show a bulk sample to be machined in a particle beam system. For example, the particle beam system can be a FIB system (FIG. 3A) or a SEM-FIB combination system (FIG. 3B).
Figure 3B:
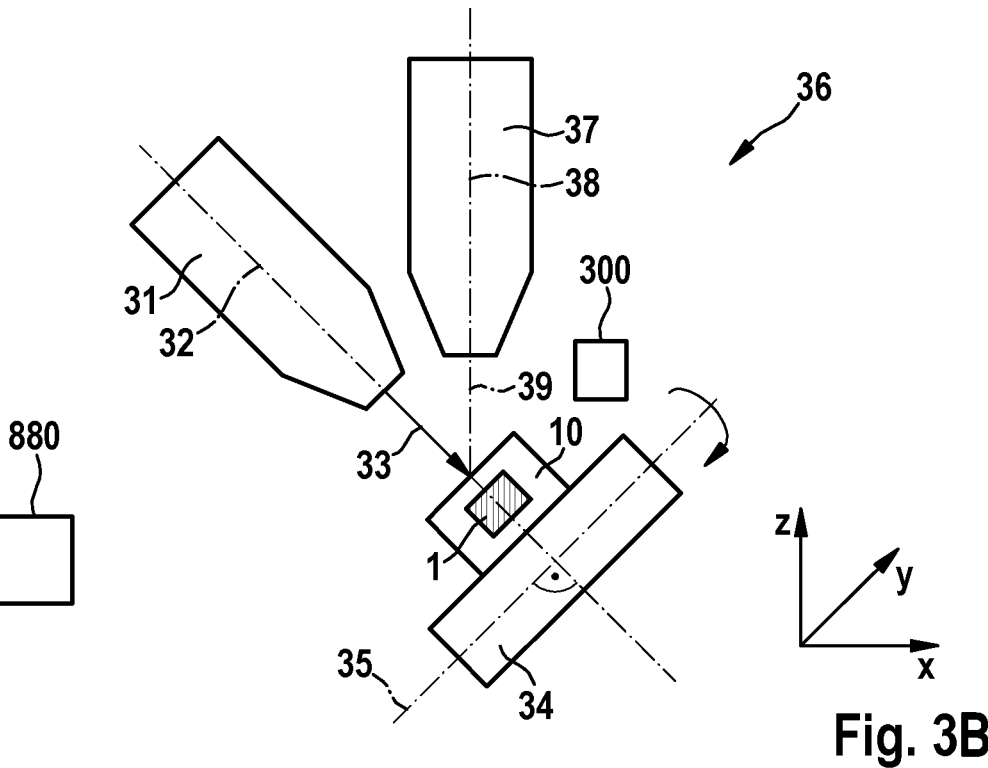

FIGS. 3A-3B show particle beam systems 30, 36, which can be used to perform the procedure of the disclosure.

The particle beam system 30, 36 is configured to accommodate and to image the bulk sample 10 and to provide a particle beam 33, 39 for removing material from the bulk sample. To that end, the particle beam system comprises a particle beam source and an optical axis along which the particle beam can propagate. Moreover, the particle beam system is configured to arrange the bulk sample in a first orientation relative to the optical axis and in a second orientation relative to the optical axis, wherein the first and the second orientation are different from each other. Finally, the particle beam system is configured to define trimming regions. The definition of a trimming region comprises the location of a volume to be removed as well as the three-dimensional extent of the volume. Hereinafter, the three-dimensional extent of the volume is also called the size of the volume. Thus, when defining a trimming region, the location (i. e. the exact position of the trimming region on the surface of the bulk sample) and the size of a volume to be removed from the bulk sample can be determined.

The definition of the trimming region(s) can be done by the user or by the particle beam system, e. g. in an automated manner.

FIG. 3A shows the situation, wherein a bulk sample 10 is machined in a FIB system 30. The bulk sample 10 comprises a VOI 1 and is arranged on a sample stage 34. To that end, the bulk sample 10 can be held by a sample holder in the particle beam system, the sample holder being arranged on the sample stage 34.

Advantageously, the sample stage 34 comprises several degrees of freedom of movement, e. g. at least five degrees of movement so that the sample can be moved in several ways and orientations. For example, the sample stage 34 can comprise three lateral axes, for the movement in directions x, y and z, as well as a rotation axis, which is parallel to the y-axis. Moreover, the sample stage can comprise a rotation axis Rx 35 which is parallel to axis x. Thus, the sample can be rotated relative to the optical axis 32 of the particle beam column.

However, the disclosure is not restricted to the disclosed arrangement of axes. It is also possible that the translatory axes and/or rotatory axes are arranged in an alternative manner or that the embodiment of the sample stage provides even more degrees of freedom of movement.

It turned out that it can be advantageous, if the rotation axis Rx 35 is perpendicular to the optical axis 32 of the focused ion beam (FIB) column. In particular, it can be advantageous if the rotation axis Rx 35 intersects the optical axis 32 of the particle beam system.

It is also possible to rotate the sample with the help of an additional stage (so-called sub-stage) which can be mounted onto the sample stage 34 or the sample holder. The sub-stage can provide at least one further degree of movement.

For example, a known sub-stage provides an additional rotation axis, that is aligned in an angle of 45° relative to the rotation axis of the sample stage.

The FIB system 30 shown in FIG. 3A comprises an ion beam column 31, which is configured to generate a beam of focused ions 33, which is directed towards the bulk sample 10 to be machined. The ion beam column 31 comprises an optical axis 32, along which the focused ion beam 33 propagates.

During operation, a beam of ions 33 is produced and directed to the sample 10, which is arranged in the sample chamber of the FIB system 30. The ion beam 33 can be used to image the sample 1, 10 and/or to remove material from the sample 1, 10 by so-called milling. In some cases, low beam currents are used for imaging purposes, while high beam currents are used for milling. The milling process can be supported by feeding a suitable process gas via a gas injection system (GIS) into the sample chamber.

To schedule the material removal, the particle beam system 30 is configured to define one or more trimming regions on the basis of an image of the sample. A trimming region determines a volume of material to be removed from the bulk sample. The volume can be characterized by its location and its size.

The trimming region can be defined with the help of a graphical user interface of the particle beam system and an image of the sample. To that end, milling boxes can be shown in the image. Not only the location of the region to be milled can be determined in that way. All other milling parameters e. g. milling speed, milling patterns, dwell time, and milling current, can be defined depending on the sample.

Since there are several parameters that can be varied in this process, it might be advantageous to define an overall FIB exposing strategy related to each individual sample.

In the procedure of the disclosure, different trimming regions are used to define the different volumes to be removed.

Each of the volumes can be removed with different milling parameters. In particular, for example it makes sense to reduce milling current, when getting closer to the VOI.

Moreover, the ongoing of the milling can be observed and controlled by imaging the sample.

In order to record images of the sample, the particle beam system comprises at least one detector 300. The detector is configured to detect interaction products (particles or radiation) of the interaction between the impinging particle beam and the material of the sample. For example, the detector 300 can be a SE (secondary electron) detector, a BSE (backscattered electron) detector or an ion detector. Usually, the particle beam system can provide several detectors. This allows to record images based on different contrasts.

Alternatively, the method according to the present disclosure can be performed using a SEM-FIB combination system 36, which is shown in FIG. 3B as another example of a particle beam system. Like the FIB system 30, the SEM-FIB combination system 36 comprises an ion beam column 31 with an optical axis 33, as well as a sample stage 34. The ion beam column 31 is configured to generate a beam of focused ions 33, as described above.

Additionally, the SEM-FIB combination system 36 comprises the functionalities of a scanning electron microscope (SEM). To that end, the SEM-FIB combination system 36 comprises an electron beam column 37, which is configured to generate a beam of electrons 39. The electron beam column 37 comprises an optical axis 38, along which the electron beam 39 propagates.

As described for the FIB system 30 (FIG. 3A), the SEM-FIB combination system 36 is also configured to define trimming regions and to record images of the sample. Therefore, at least one detector 300 is provided in the SEM-FIB combination system 36.

Moreover, the particle beam system 30, 36 comprises a controller unit 880. The controller unit 880 is configured to execute a sequence of control commands, which can be provided in form of a computer program product. By executing the sequence of control commands, the particle beam system 30, 36 is caused to execute a method according to the disclosure.

Figure 7:
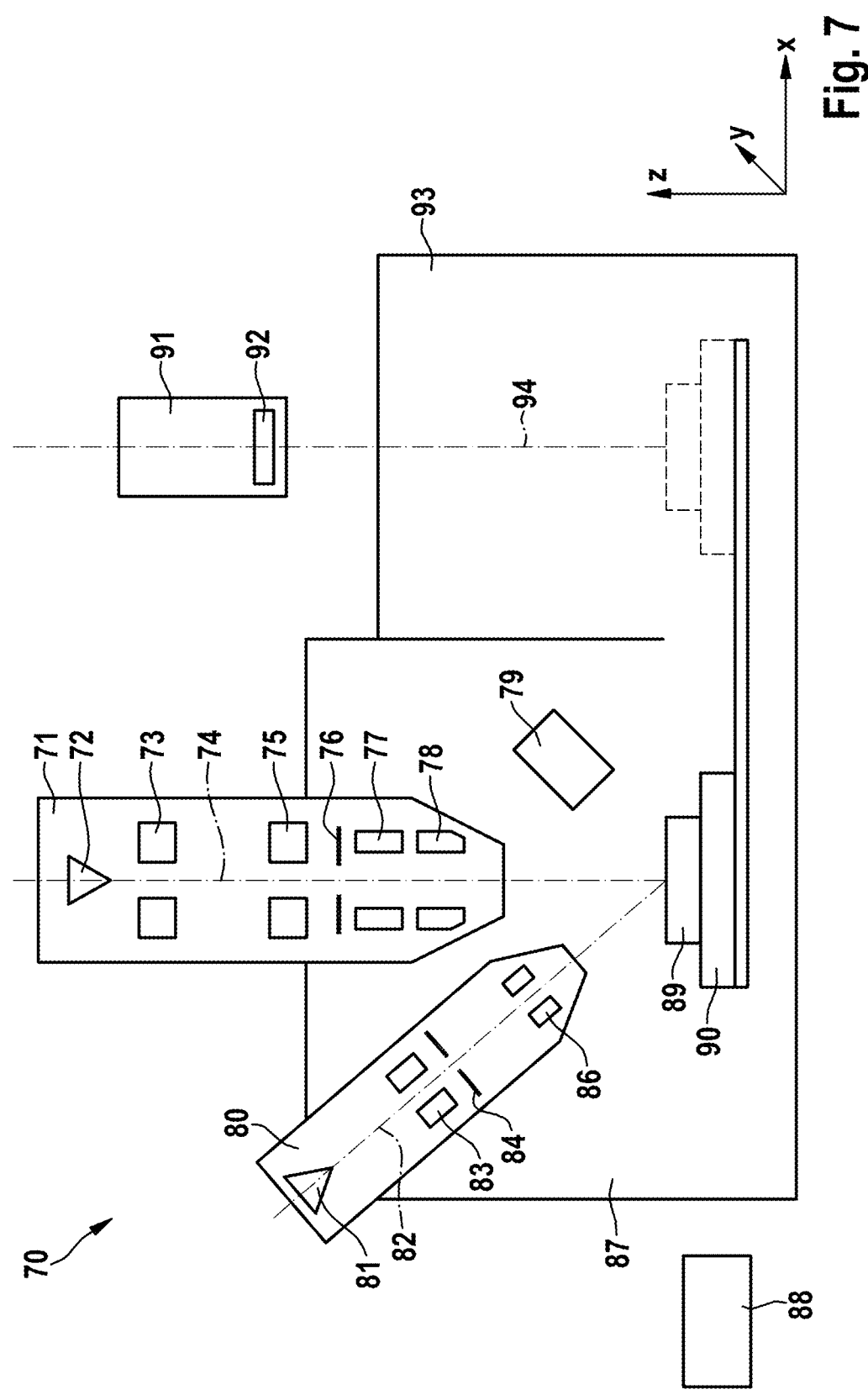
FIG. 7 shows a FIB-SEM-laser system, which can be used to perform the method of the disclosure.

It is also conceivable to remove the volume of the bulk sample material with the help of a laser. To that end, a combination system (FIB-SEM-laser system) comprising a laser system can be used, as shown in FIG. 7.

Figure 4:
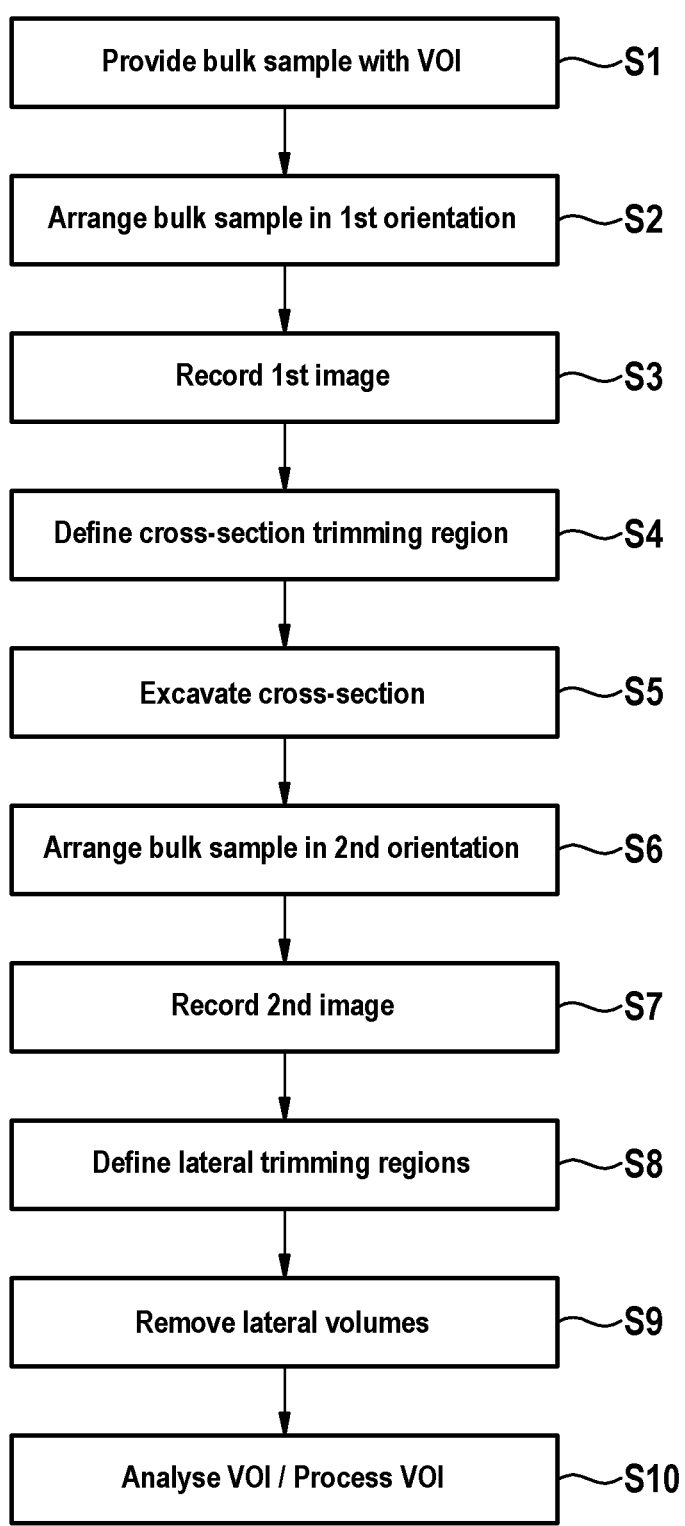
FIG. 4 shows a flow-chart of an exemplary embodiment of the disclosure. Here, in the first trimming step, a cross-section is created.

FIG. 4 shows a flow-chart of an exemplary embodiment of the disclosure. The method according to the disclosure is performed using a particle beam system as shown in FIG. 3 or in FIG. 7.

In a first step S1, a bulk sample comprising a VOI is provided. To that end, the bulk sample is held on a sample stage within the sample chamber of the particle beam system.

In step S2, the bulk sample is arranged in a first orientation relative to the optical axis of the particle beam system, along which the milling particle beam propagates. For example, the bulk sample can be oriented in such a way that the front side F of the VOI 1, 21 is more or less parallel to the optical axis of the ion beam column.

Then (step S3) a first image of the bulk sample is recorded, while the bulk sample is arranged in the first orientation. For obtaining images, the particle beam system comprises at least one detector for detecting the interaction products of the interaction of the particle beam and of the sample material. Based on the detected interaction products, an image of the bulk sample is generated.

With the help of the image, a first trimming region is defined in step S4. The first trimming region determines a first volume to be removed from the bulk sample. In the exemplary embodiment of FIG. 4, the first trimming region is a cross-section trimming region, because the removal of the selected material volume will create a cross-section through the bulk sample near the VOI or adjacent to the VOI.

Then (step S5), the volume defined by a first trimming region (i.e. cross-section trimming region) is removed by machining the bulk sample with the particle beam. This means that the volume between the VOI 1 and the front surface 7 of the bulk sample 10 is milled. In other words: A cross-section is cut near the VOI or adjacent to the VOI by removing the volume of the cross-section trimming region with a milling particle beam (e. g. focused ion beam FIB or laser beam).

In general, it is advantageous to approach the VOI in a stepwise manner. For example, the removal of bulk material can start with a coarse cutting procedure such as cutting with a knife, microtome, saw or milling machine, followed by milling with a laser beam. Then, material can be removed with a coarse FIB (i. e. a FIB operated with a high beam current), and finally with a fine FIB (i. e. a FIB operated with a low beam current).

Depending on type and accuracy of the used particle beam, the location of the milling site respectively the cut should be selected as close as possible to the VOI, but as far as possible to prevent the impinging particle beam from damaging the VOI.

Consequently, when ablating bulk material with a laser beam, this should be done down to a distance of about 100 μm to 20 μm from the VOI (depending on the accuracy of the laser), with a more accurate laser down to 10 μm or 5 μm, for example. When ablating material with FIB coarse milling, this should be done down to a distance of 5 μm or 2 μm from the VOI Bulk material closer to the VOI as about 2 μm to 5 μm should be removed with the help of FIB fine milling. The sample layer revealed by FIB fine milling can be used as a first layer of the tomography procedure.

In a next step S6, the bulk sample is arranged in a second orientation relative to the optical axis, the second orientation being different from the first orientation. This can be managed by rotating the bulk sample. To do so, the sample stage can be rotated, e. g. by 90° around axis Rx. In the second orientation, the previously prepared cross-section is essentially facing the impinging particle beam.

In a beneficial embodiment, the impinging particle beam is essentially perpendicular to the previously created cross-section, i. e. the angle between the optical axis and the cross-section plane is about 90°.

Then (step S7), a second image of the bulk sample is recorded.

With the help of the second image, a second trimming region and a third trimming region can be defined (step S8). In the exemplary embodiment of FIG. 4, the second and the third trimming region are lateral trimming regions 24, 25, because both regions are located adjacent to the VOI 21 at opposite sides of the VOI, as shown in FIG. 2.

It is also conceivable to change the orientation of the bulk sample before defining the third trimming region 25. Moreover, it is conceivable to record a third image, on the basis of which the third trimming region is defined.

In the workflow of FIG. 4, in step S9 the lateral volumes of material are removed with the help of the particle beam. At the end of this step, a more or less free-standing VOI is created, as shown in FIGS. 1C, 2E and 6E. The VOI is almost dissociated from the bulk sample, whereas the rear side of the VOI is the only connecting element between VOI and bulk material.

After having performed the previous steps of the procedure, the exposed VOI can serve as a tomographic sample that can be analyzed and/or processed in subsequent steps or procedures (step S10), e. g. FIB/SEM tomography. To that end, the bulk sample respectively the VOI can be rotated by −90° around axis Rx according to the example mentioned above.

In FIB/SEM tomography, individual planes of the three-dimensional sample are optically magnified and imaged without superposition. To that end, the exposed VOI is stepwise ablated by milling with the FIB, so that sample material is removed layer by layer. A layer exposed in such a manner is imaged with the help of the SEM functionalities of the SEM-FIB combination system, thus delivering a series of images. Then, on the basis of the image series (i. e. a stack of images) the three-dimensional structure of the sample can be represented in a 3D reconstruction.

Figure 5:
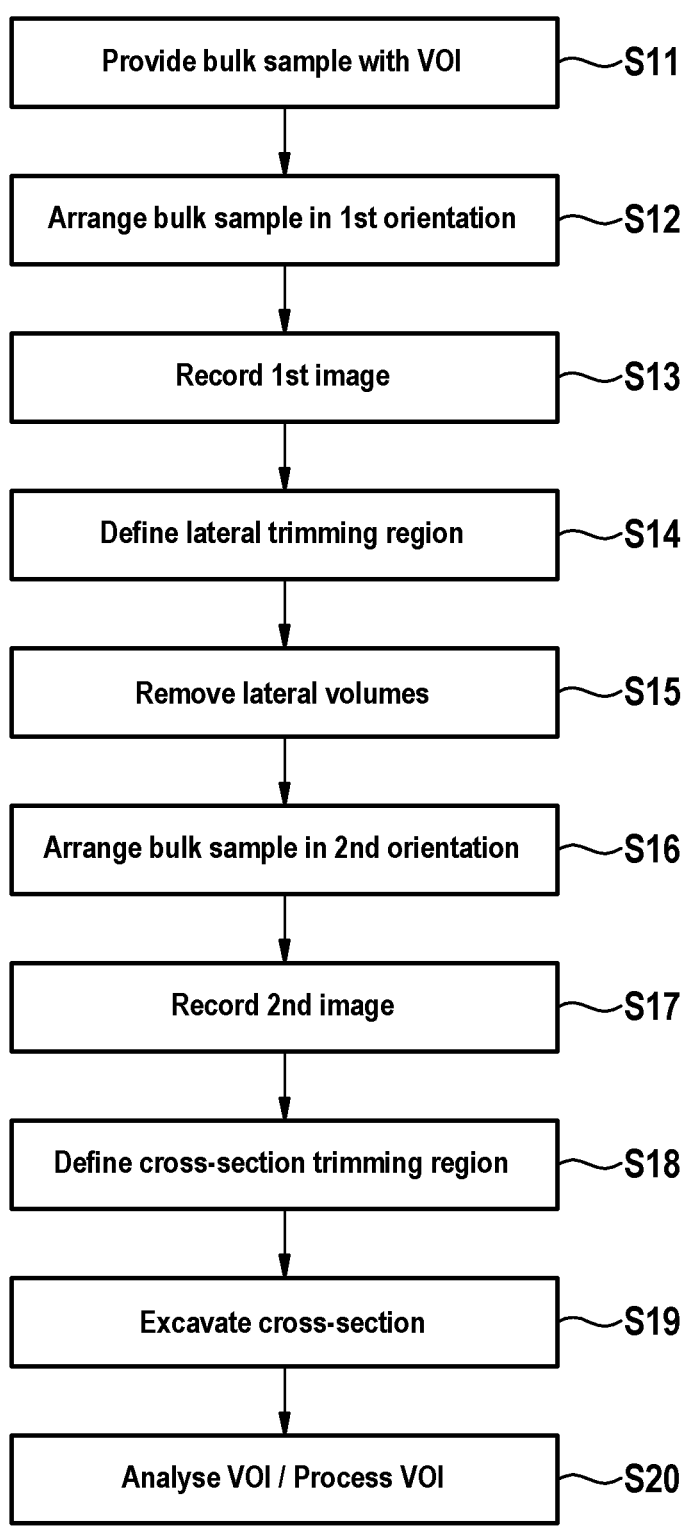
FIG. 5 shows a flow-chart of another exemplary embodiment of the disclosure. Here, the cross-section is created in the last trimming step.

FIG. 5 shows the flow-chart of an alternative embodiment of the method. The embodiments of FIG. 4 and FIG. 5 differ in the sequence of the procedural steps of defining the different trimming regions and changing the orientation of the bulk sample (including the VOI).

Consequently, steps S11 to S13, which concern providing a bulk sample, arranging the bulk sample in a first orientation and recording a first image are the same as steps S1 to S3, respectively, as described for FIG. 4.

Then (step S14), a trimming region is defined. In the case of the embodiment of FIG. 5 this step concerns the definition of the lateral trimming regions 24, 25.

In step S15 the lateral volumes are removed from both sides of the VOI.

Then, (step S16) the bulk sample is arranged in a second orientation relative to the optical axis.

In step S17 a second image of the bulk sample is recorded.

On basis of the second image, a cross-section trimming region 23 is defined in step S18, as described for step S4 of FIG. 4.

Finally (step S19), the determined volume is excavated and the cross-section is created.

In step S20 the exposed VOI can be analyzed by FIB/SEM tomography or processed in any other way.

In reference to both variants of the method shown in FIG. 4 and FIG. 5, in an embodiment, the cross-section exhibits a cross-section plane, wherein the cross-section plane is essentially parallel to the optical axis of the particle beam system, when the bulk sample is arranged in the first orientation.

In an embodiment, the cross-section is essentially facing the impinging beam, when the sample is held in the second orientation. This means that the cross-section is oriented perpendicularly to the optical axis of the particle beam system.

FIGS. 6A-6E show a schematic layout of an embodiment of the disclosure in three-dimensional representation in order to illustrate the spatial extent of a sample to be prepared.

The bulk sample 60 is arranged on a sample stage 63 within the sample chamber of the particle beam system. The volume of interest 61 is located within the bulk sample 60.

The bulk sample 60 comprises at least a top surface 62, a front surface 65 and a bottom surface 66 (FIGS. 6A-6D).

During the procedure, the particle beam 64 impinges on the top surface 62. The particle beam can be oriented parallel to the front surface 65. A milling groove 68 (i. e. a milling trench parallel to the impinging particle beam) can be excavated by milling with the particle beam, so that the first side of the VOI (F, front side) is exposed. The milling groove 68 is excavated by milling with a particle beam is more or less parallel to front side F.

Then, the bulk sample is rotated by rotating the sample stage around axis Rx. It is advantageous, if the axis Rx is arranged essentially perpendicular to the optical axis of the particle beam system. Thus, the axis Rx is essentially perpendicular to the impinging particle beam.

Figures 6A, 6B, 6C:
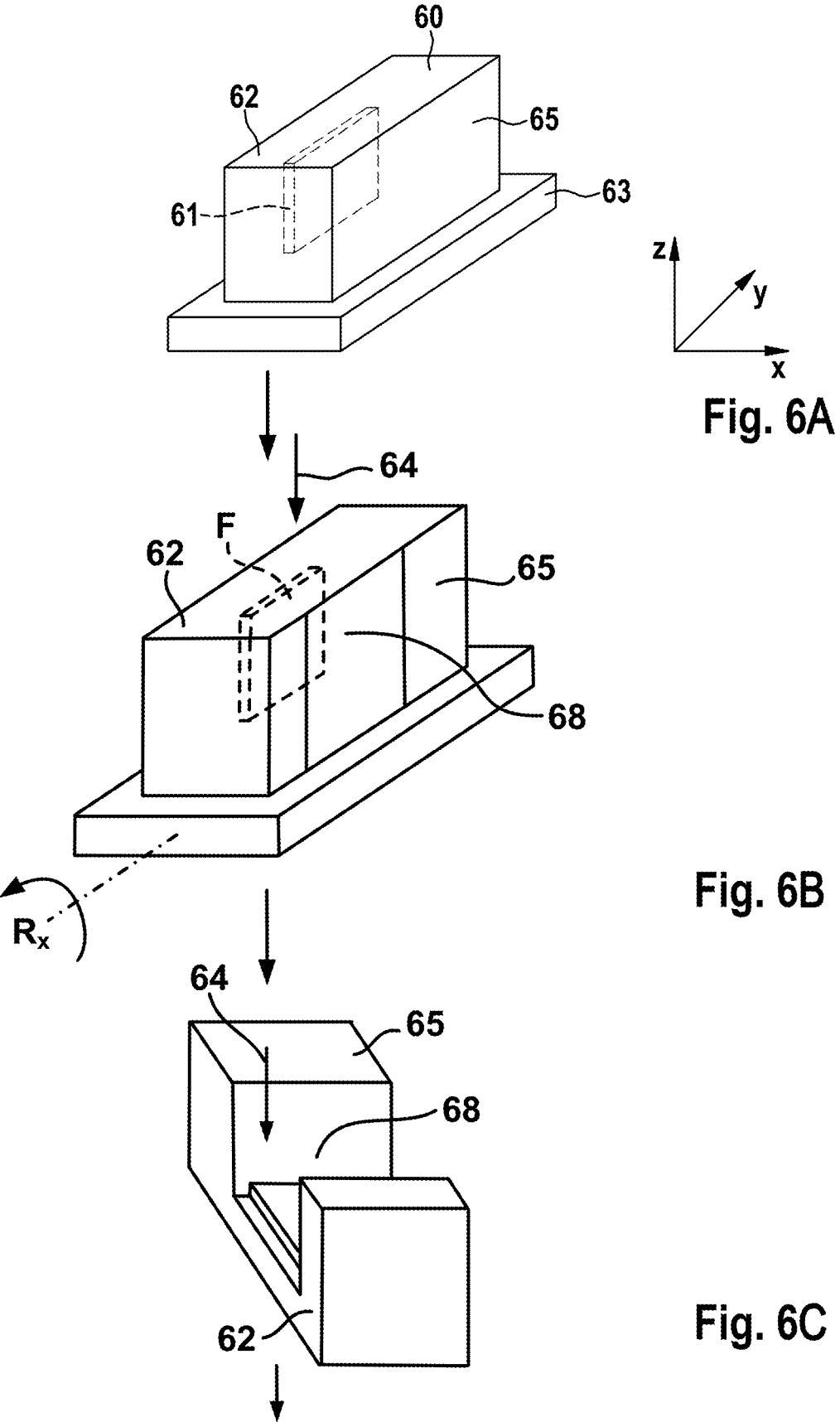
FIGS. 6A-6E show a schematic layout of an embodiment of the disclosure in three-dimensional representation in order to illustrate the spatial extent of a sample to be prepared.
Figures 6D, 6E:
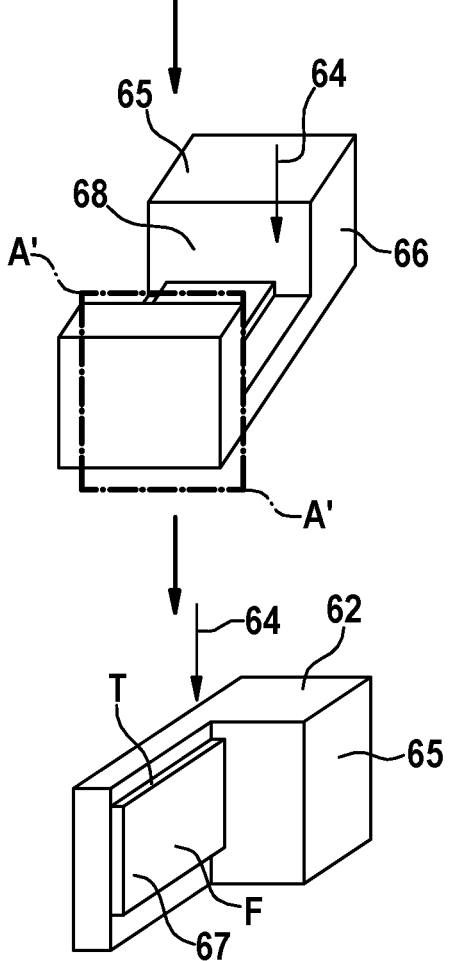

After rotating the sample around Rx, the first side of the VOI is facing the impinging particle beam 64, i. e. the bottom of the milling groove 68 is also facing the impinging particle beam 64 (FIG. 6C).

Then, a first lateral volume is removed (FIG. 6C), and a second lateral volume is removed (FIG. 6D).

Finally, the bulk sample shows an exposed VOI 67 (FIG. 6E) having an exposed front side F, as shown in sectional view A' (as indicated in FIG. 6D).

Advantageously, the embodiments of the disclosure are carried out with a FIB-SEM-laser system 70, as shown in FIG. 7. The FIB-SEM-laser system 70 is configured to provide a focused ion beam and a laser beam, so that two different particle beams with milling to capacity are provided. Moreover, the system 70 is also configured to provide a further particle beam (i. e. an electron beam) which can be used for imaging purposes.

As for the configuration of the particle beams in the FIB-SEM-laser system, different embodiments are possible: Electron beam and ion beam can be directed close to the same spot on the sample. Alternatively, it is also conceivable that all three particle beams (electron beam, ion beam and laser) are directed onto or to the same spot on the sample.

The FIB-SEM-laser system 70 comprises two particle beam columns, i. e. an electron beam column 71 for generating an electron beam and an ion beam column 80 for generating a focused ion beam. Both particle beams can be directed to, or close to the milling spot on the sample 89. Advantageously, both beams coincide in a coincidence point.

Usually, the sample 89 to be analyzed or machined is provided on a sample stage 90 and located within the sample chamber 87, which can be maintained under vacuum conditions.

The sample stage 90 can be a multiple-axes stage with at least five movement axes. This means that the sample receptable can be shifted in the directions x, y and z, which are three spatial directions usually perpendicular to each other. Moreover, a tilting axis and a rotation axis are provided. The rotation axis can be aligned with one of the spatial directions x, y or z. Alternatively, the tilt axis can be aligned perpendicular to a plane defined by one of the optical axes of the particle beam system.

During operation, primary electrons are generated in the electron source 72. The primary electrons are accelerated along the optical axis 74 of the electron beam column 71, focused by a first condenser lens system 73 and a second condenser lens system 75 and cut by an aperture 76. Moreover, the electron beam column 71 comprises a deflection system 77 which allows scanning the electron beam across the sample 89. In order to focus the beam of primary electrons on the sample 89, the electron beam column also comprises an objective lens 78.

The FIB-SEM-laser system 70 comprises at least one detector 79 for detecting the interaction products of the interaction between the particles of the primary electron beam and/or the focused ion beam and the sample material.

Further, the FIB-SEM-laser system 70 comprises an ion beam column 80 including an ion source 81, a deflection system 83, an aperture 84 and an objective lens 86. The ion source 81 can be a liquid metal ion source (LMIS), which is operated for example with a gallium source. Alternatively, the ion source 81 can be designed as a plasma ion source (e. g. with Xenon or Argon as ion source).

The ions generated within the ion source 81 are accelerated along the optical axis 82 of the ion beam column 80 and focused with the help of objective lens 86. The ions impinging on the sample can be used in order to remove material of the sample by milling and/or to generate an image of the sample 89 by detecting secondary particles or radiation.

Moreover, the FIB-SEM-laser system 70 comprises a laser system 93, which is configured to provide a laser, which can be a pulsed laser. In an embodiment, the laser system 93 is configured to provide a femto-, pico- or nanosecond laser.

The laser beam generated by the laser source 91 propagates along the optical axis 94 of the laser system and can be directed to the sample 89. With the help of objective lens 92, the laser beam can be focused onto the sample 89 in order to ablate material of the sample 89.

The optical axis 94 can be arranged parallelly to another optical axis of the FIB-SEM-laser system 70, for example the optical axis 94 of the laser can be parallel to the optical axis 74 of the electron beam column, as shown in FIG. 7.

Unlike the particle beam system shown in FIG. 7, the laser system can also be arranged within the sample chamber 87 of the FIB-SEM-laser system 70. In such an embodiment, the laser beam can be directed to the common coincidence point of electron beam and ion beam so that milling and imaging are facilitated.

The FIB-SEM-laser system 70 comprises a controller unit 88 for receiving a computer program product, which comprises a sequence of control commands. The controller unit 88 is configured to execute a sequence of control commands. When executing the sequence, the FIB-SEM-laser system 70 is caused to execute a method according to the disclosure.

REFERENCE SIGNS 1 volume of interest (VOI)
2 first side (front side)
3 second side (top side)
4 third side (bottom side)
5 fourth side (rear side)
6 top surface of bulk sample
7 front surface of bulk sample
8 bottom surface of bulk sample
9 rear surface of bulk sample
10 bulk sample
11 removed bulk material
13 first lateral side of VOI
13' second lateral side of VOI
14 milling groove
A sectional view
B third side (bottom side)
F first side (front side)

R forth side (rear side)
T second side (top side)
Dt distance between top side of VOI and top surface of bulk sample
db distance between bottom side of VOI and bottom surface of bulk sample
Df distance between front side of VOI and front surface of bulk sample
20 bulk sample
21 volume of interest (VOI)
22 particle beam
23 first trimming volume to be removed
24 second trimming volume to be removed
24a adjacent part of second trimming volume
25 third trimming volume to be removed
25a adjacent part of the third trimming volume
26 cross-section
27 exposed VOI
F front side of the VOI
R rear side of the VOI
30 FIB system
31 ion beam (FIB) column
32 optical axis of ion beam column
33 focused ion beam (FIB)
34 sample stage
35 rotation axis Rx
36 SEM-FIB combination system
37 electron beam column
38 optical axis of electron beam column
39 electron beam
300 detector
880 controller unit
S1 Providing a bulk sample with VOI
S2 Arranging bulk sample in $1^{st}$ orientation
S3 Recording $1^{st}$ image
S4 Defining a cross-section trimming region
S5 Excavating the cross-section
S6 Arranging bulk sample in $2^{nd}$ orientation
S7 Recoding a $2^{nd}$ image
S8 Defining lateral trimming region
S9 Removing lateral volumes
S10 Analyzing VOI/Processing VOI
S11 Providing a bulk sample with VOI
S12 Arranging bulk sample in $1^{st}$ orientation
S13 Recording $1^{st}$ image
S14 Defining lateral trimming regions
S15 Removing lateral volumes
S16 Arranging bulk sample in $2^{nd}$ orientation
S17 Recording $2^{nd}$ image
S18 Defining a cross-section trimming region
S19 Excavating the cross-section
S20 Analyzing VOI/Processing VOI
60 bulk sample
61 volume of interest (VOI)
62 top surface of bulk sample
63 sample stage
64 particle beam
65 front surface of bulk sample
66 bottom surface of bulk sample
67 exposed VOI
68 milling groove
A' sectional view
Rx rotation axis
70 FIB-SEM-laser system
71 electron beam column
72 electron source
73 first condenser system

16

74 optical axis of the electron column
75 second condenser lens system
76 aperture
77 deflection system
78 objective lens (electrons)
79 detector
80 ion beam column
81 ion source
82 optical axis of the ion column
83 deflection system
84 aperture (FIB)
86 objective lens (FIB)
87 sample chamber
88 controller unit
89 sample
90 sample stage
91 laser source
92 objective lens (laser)
93 laser system
94 optical axis of laser
101 particle beam
102 milling trench
103 front side of VOI
104 volume of interest (VOI)
105 milling groove
106 remaining bulk material
107 milling box
D depth of the milling groove

What is claimed is:

1. A method of exposing a volume of interest (VOI) present in a bulk sample, the method comprising:
arranging the bulk sample in a first orientation relative to an optical axis of a particle beam system configured to provide a particle beam along its optical axis;
recording an image of the bulk sample while the bulk sample is in the first orientation;
based on the first image, defining a first trimming region which determines a location and a size of a first volume of the bulk sample;
using the particle beam to remove the first volume from the bulk sample to expose a first surface of the VOI;
arranging the bulk sample in a second orientation relative to the optical axis of the particle beam system, the second orientation being different from the first orientation;
recording a second image of the bulk sample while the bulk sample is in the second orientation;
based on the second image of the bulk sample, defining a second trimming region which determines a location and a size of a second volume of the bulk sample;
using the particle beam to remove the second volume from the bulk sample to expose a second surface of the VOI, the second surface being different from the first surface, the second surface directly contacting the first surface;
based on the second image, defining a third trimming region which defines a location and a size of a third volume of the bulk sample; and
using the particle beam to remove the third volume from the bulk sample to expose a third surface of the VOI, the third surface being different from both the first and second surfaces, the third surface directly contacting the first surface.

2. The method of claim 1, further comprising, after removing the first, second and third volumes of the bulk sample, tomographically analyzing the VOI.

3. The method of claim 2, wherein removing the first volume from the bulk sample exposes a cross-section plane that is parallel to the optical axis when the bulk sample is arranged in its first orientation.

4. The method of claim 3, wherein, when the bulk sample is in its second orientation, the cross-section plane faces the particle beam.

5. The method of claim 4, wherein the second volume is adjacent a first side of the VOI, the third volume is adjacent a second side of the VOI, and the first and second sides of the VOI are opposite sides of the VOI.

6. The method of claim 5, wherein the particle beam system comprises a rotation axis that allows arranging the bulk sample in the first orientation and in the second orientation by rotating the bulk sample around the rotation axis.

7. The method of claim 1, wherein removing the first volume from the bulk sample exposes a cross-section plane that is parallel to the optical axis when the bulk sample is arranged in its first orientation.

8. The method of claim 1, wherein:

removing the first volume from the bulk sample exposes a cross-section of the bulk sample; and when the bulk sample is in its second orientation, the cross-section of the bulk sample faces the particle beam.

9. The method of claim 1, wherein the second volume is adjacent a first side of the VOI, the third volume is adjacent a second side of the VOI, and the first and second sides of the VOI are opposite sides of the VOI.

10. The method of claim 1, wherein the particle beam system comprises a rotation axis that allows arranging the bulk sample in the first orientation and in the second orientation by rotating the bulk sample around the rotation axis.

11. The method of claim 10, wherein the bulk sample is rotated by 90° around the rotation axis to move the bulk sample from the first orientation to the second orientation, and the bulk sample is rotated by −90° around the rotation axis to move from the second orientation to the first orientation.

12. The method of claim 1, wherein the particle beam system comprises a FIB system.

13. The method of claim 1, wherein the particle beam system comprises a laser system.

14. One or more machine-readable hardware storage devices comprising instructions that are executable by one or more processing devices of a particle beam system to perform operations comprising:

arranging a bulk sample in a first orientation relative to an optical axis of the particle beam system configured to provide a particle beam along its optical axis, a volume of interest (VOI) being present in the bulk sample;

recording an image of the bulk sample while the bulk sample is in the first orientation;

based on the first image, defining a first trimming region which determines a location and a size of a first volume of the bulk sample;

using the particle beam to remove the first volume from the bulk sample to expose a first surface of the VOI;

arranging the bulk sample in a second orientation relative to the optical axis of the particle beam system, the second orientation being different from the first orientation;

recording a second image of the bulk sample while the bulk sample is in the second orientation;

based on the second image of the bulk sample, defining a second trimming region which determines a location and a size of a second volume of the bulk sample;

using the particle beam to remove the second volume from the bulk sample to expose a second surface of the VOI, the second surface being different from the first surface, the second surface directly contacting the first surface;

based on the second image, defining a third trimming region which defines a location and a size of a third volume of the bulk sample; and using the particle beam to remove the third volume from the bulk sample to expose a third surface of the VOI, the third surface being different from both the first and second surfaces, the third surface directly contacting the first surface.

15. A particle beam system comprising:

one or more processing devices; and one or more machine-readable hardware storage devices comprising instructions that are executable by the one or more processing devices to perform operations comprising:

arranging a bulk sample in a first orientation relative to an optical axis of the particle beam system configured to provide a particle beam along its optical axis, a volume of interest (VOI) being present in the bulk sample;

recording an image of the bulk sample while the bulk sample is in the first orientation;

based on the first image, defining a first trimming region which determines a location and a size of a first volume of the bulk sample;

using the particle beam to remove the first volume from the bulk sample to expose a first surface of the VOI;

arranging the bulk sample in a second orientation relative to the optical axis of the particle beam system, the second orientation being different from the first orientation;

recording a second image of the bulk sample while the bulk sample is in the second orientation;

based on the second image of the bulk sample, defining a second trimming region which determines a location and a size of a second volume of the bulk sample;

using the particle beam to remove the second volume from the bulk sample to expose a second surface of the VOI, the second surface being different from the first surface, the second surface directly contacting the first surface;

based on the second image, defining a third trimming region which defines a location and a size of a third volume of the bulk sample; and using the particle beam to remove the third volume from the bulk sample to expose a third surface of the VOI, the third surface being different from both the first and second surfaces, the third surface directly contacting the first surface.

* * * * *